(12) United States Patent
Karim et al.

(10) Patent No.: US 11,979,979 B2
(45) Date of Patent: May 7, 2024

(54) CROSSTALK CANCELLATION FOR SIGNAL LINES

(71) Applicant: Micron Technology, Inc., Boise, ID (US)

(72) Inventors: M. Ataul Karim, Boise, ID (US); David K. Ovard, Meridian, ID (US); Aparna U. Limaye, Boise, ID (US); Timothy M. Hollis, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 349 days.

(21) Appl. No.: 17/238,797

(22) Filed: Apr. 23, 2021

(65) Prior Publication Data
US 2022/0346220 A1  Oct. 27, 2022

(51) Int. Cl.
*H05K 1/02* (2006.01)
*H04B 3/32* (2006.01)
*H04B 3/487* (2015.01)

(52) U.S. Cl.
CPC .............. *H05K 1/0233* (2013.01); *H04B 3/32* (2013.01); *H04B 3/487* (2015.01); *H05K 1/0228* (2013.01)

(58) Field of Classification Search
CPC ................................. H04B 3/32; H05K 1/0233
USPC .......................................................... 333/4, 5
See application file for complete search history.

(56) References Cited

U.S. PATENT DOCUMENTS

| | | | |
|---|---|---|---|
| 2004/0227573 A1* | 11/2004 | Soda .................. | H03F 1/483 330/253 |
| 2016/0006407 A1* | 1/2016 | Brooks ............... | H04L 12/2801 333/132 |

OTHER PUBLICATIONS

Lee et al., "An 8nm 18Gb/s/pin GDDR6 PHY with TX Bandwidth Extension and RX Training Technique", article, 2020, Samsung Electronics, Hwaseong, Korea (3 pages).

* cited by examiner

*Primary Examiner* — Rakesh B Patel
(74) *Attorney, Agent, or Firm* — Holland & Hart LLP

(57) ABSTRACT

Methods, systems, and devices for crosstalk cancellation for signal lines are described. In some examples, a device (e.g., a host device or a memory device) may generate a first signal and may invert the first signal to obtain an inverted first signal. The device may obtain a second signal based on attenuating a first range of frequencies of the inverted first signal and a second range of frequencies of the inverted first signal, where the first range of frequencies is below a first threshold frequency and the second range of frequencies is above a second threshold frequency that is greater than the first threshold frequency. The device may transmit the first signal via a first signal line of a set of signal lines and the second signal line via a second signal line of the set of signal lines.

16 Claims, 7 Drawing Sheets

CROSSTALK CANCELLATION FOR SIGNAL LINES

FIELD OF TECHNOLOGY

The following relates generally to one or more systems for memory and more specifically to crosstalk cancellation for signal lines.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
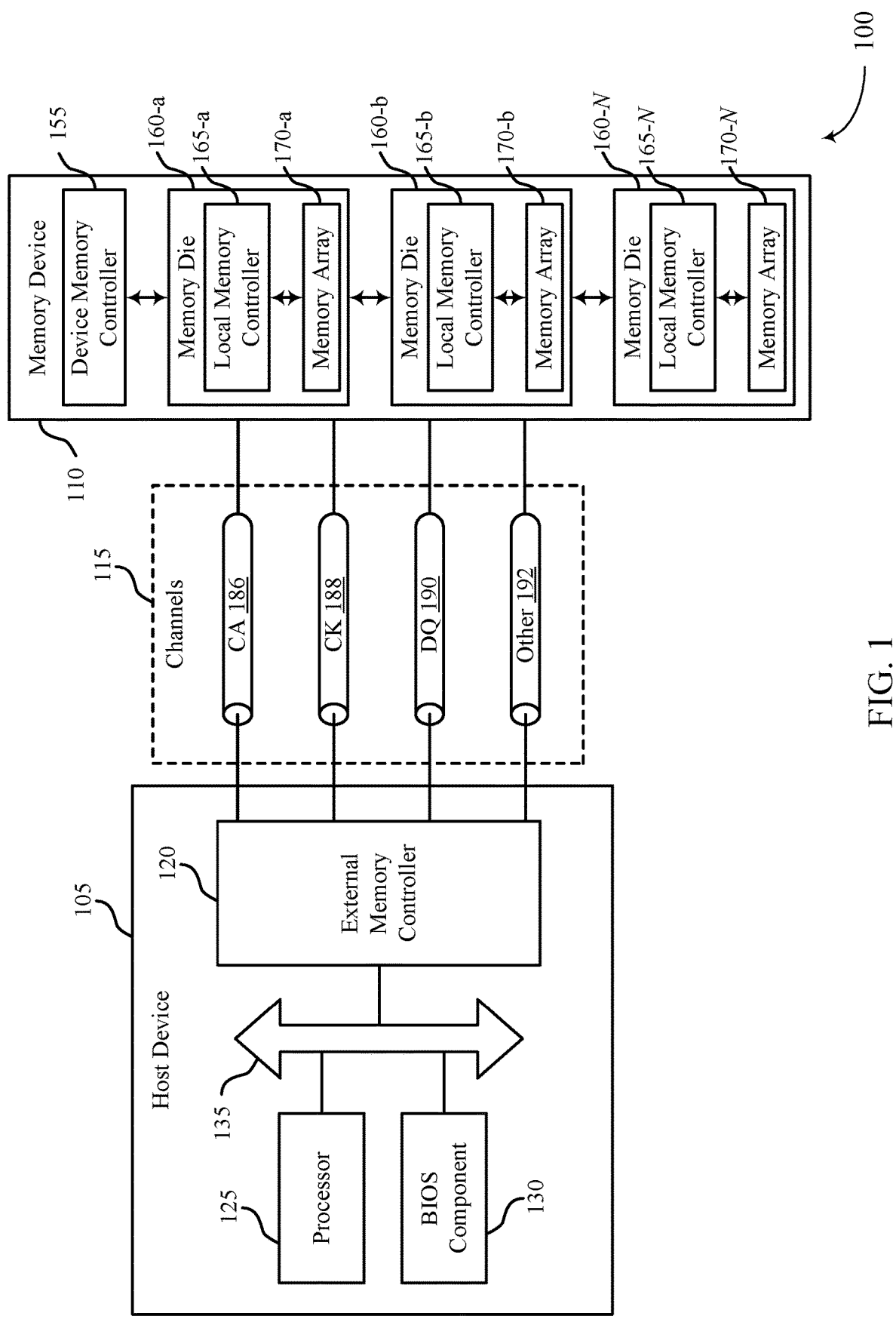
FIG. 1 illustrates an example of a system that supports crosstalk cancellation for signal lines in accordance with examples as disclosed herein.

A host device may communicate with a memory device via a set of signal lines (e.g., channels). For example, the signal lines may be included in an interconnect, such as an interposer (e.g., a silicon interposer). Each signal line may couple a respective terminal of the host device with a respective terminal of the memory device. In some examples, the host device or the memory device may transmit a first signal over a first signal line of the set of signal lines. Due to a proximity and/or a capacitance between the first signal line and a second signal line that is adjacent to the first signal line, the first signal may generate interference at the second signal line which may be referred to as cross-talk interference. The interference at the second signal line may interfere with a second signal over the second signal line. If the interference is high enough (e.g., above a threshold amount), the device receiving the second signal may fail to decode or may inaccurately decode the second signal. Failing to decode or inaccurately decoding the second signal may decrease the efficiency of communications between the host device and the memory device.

The structures and techniques described herein may enable a host device and/or a memory device to mitigate cross-talk interference between two signal lines. For instance, a transmitting device (e.g., one of the host device and the memory device) may generate a third signal that at least partially cancels out the interference introduced by the first signal on the second signal line. Generating the third signal may include inverting the first signal and filtering the inverted first signal through a band-pass filter. By generating the third signal in this manner, the amount of interference on the second signal line may decrease. Accordingly, the receiving device (e.g., the other of the host device and the memory device) may be more likely to succeed in decoding and/or to accurately decode the second signal from the transmitting device. Further, structures and techniques described herein for crosstalk cancellation may support the use of alternative interconnection designs (e.g., physical structures that include a set of signal lines or portions thereof), which may support improved bandwidth density, among other benefits that may be appreciated by those of ordinary skill in the art. Although certain examples described herein may be in the context of memory systems, the teachings herein may apply to any set of signal lines in any electronic system.

Features of the disclosure are initially described in the context of systems as described with reference to FIGS. 1 and 2. Features of the disclosure are described in the context of an interconnect, crosstalk cancellation architectures, and a timing diagram as described with reference to FIGS. 3-5. These and other features of the disclosure are further illustrated by and described with reference to an apparatus diagram and flowcharts that relate to crosstalk cancellation for signal lines as described with reference to FIGS. 6-7.

FIG. 1 illustrates an example of a system 100 that supports crosstalk cancellation for signal lines in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125. In some examples, memory device 110-*a* may be an example of a high-bandwidth memory (HBM) device.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 (e.g., memory die 160 *a*, memory die 160 *b*, memory die 160 N) may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, a host device 105 may communicate with a memory device 110 via a set of signal lines. Each signal line may couple a respective terminal of the host device 105 with a respective terminal of the memory device 110. In some cases, the signal lines may be included in an interconnect, such as in an interposer (e.g., a silicon interposer). Additionally, other interconnect structures (e.g., more dense interconnect structures), such as an embedded multi-die interconnect bridge (EMIB) may be used in place of or along with the interposer.

In some examples, the host device 105 or the memory device 110 may transmit a first signal over a first signal line of the set of signal lines. Due to a proximity and/or a capacitance between the first signal line and a second signal line that is adjacent to the first signal line, the first signal may generate interference at the second signal line which may be referred to as cross-talk interference. The interference at the second signal line may interfere with a second signal over the second signal line. If the interference is high enough (e.g., above a threshold amount), the device receiving the second signal may fail to decode or may inaccurately decode the second signal. Failing to decode or inaccurately decoding the second signal may decrease the efficiency of communications between the host device 105 and the memory device 110.

The methods described herein may enable a host device 105 and/or a memory device 110 to mitigate cross-talk interference between two signal lines. For instance, a transmitting device (e.g., one of the host device 105 and the memory device 110) may generate a third signal that at least partially cancels out the interference introduced by the first signal on the second signal line. Generating the third signal may include inverting the first signal and filtering the inverted first signal through a band-pass filter. By generating the third signal in this manner, the amount of interference on the second signal line may decrease. Accordingly, the receiving device (e.g., the other of the host device 105 and the memory device 110) may be more likely to succeed in decoding and/or to accurately decode the second signal from the transmitting device. Further, crosstalk cancellation as described herein may support the use of improved interconnects between a host device 105 and a memory device 110, such as interconnects with improved bandwidth density, among other benefits that may be appreciated by those of ordinary skill in the art. Although the methods herein are described in the context of memory systems, the methods herein may apply to any set of signal lines in any electronic system.

Figure 2:
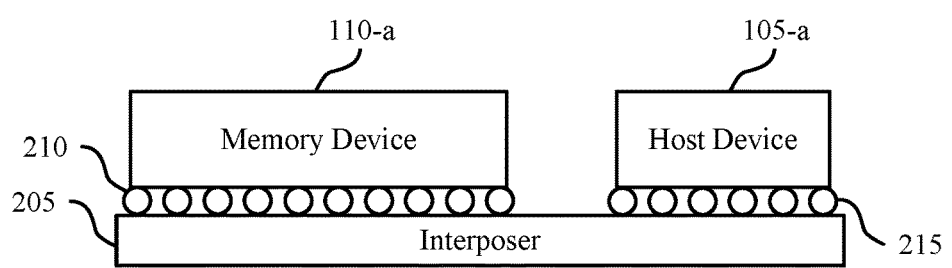
FIG. 2 illustrates an example of a system that supports crosstalk cancellation for signal lines in accordance with examples as disclosed herein.

FIG. 2 illustrates an example of a system 200 that supports crosstalk cancellation for signal lines in accordance with examples as disclosed herein. In some examples, system 200 may implement one or more aspects of system 100. For instance, host device 105-a may be an example of a host device 105 as described with reference to FIG. 1 and memory device 110-a may be an example of a memory device 110 as described with reference to FIG. 1. In some examples, host device 105-a may be an example of a graphics processing unit (GPU), a system on a chip (SoC), or an application-specific integrated circuit (ASIC). In some examples, memory device 110-a may be an example of an HBM device.

In some examples, host device 105-a may be coupled with memory device 110-a via interposer 205 (e.g., a silicon interposer). Additionally, host device 105-a and memory device 110-a may be coupled with one or more other aspects of the system 200 (e.g., a package substrate and/or a graphics card) via the interposer 205. In some examples, host device 105-a may be coupled with the interposer 205 via a set of terminals 210 and memory device 110-a may be coupled with the interposer 205 via a set of terminals 215 (e.g., terminals 210 and terminals 215 may be or may be coupled with pins or pads of the memory device 110-a and the host device 105-a). In some examples, interposer 205 may be replaced with an embedded multi-die interconnect bridge (EMIB) without deviating from the scope of the present disclosure.

At least a subset of the terminals 210 may be coupled with a respective subset of the terminals 215. For instance each terminal 210 of at least the subset of terminals 210 may be coupled with a signal line that extends to a respective terminal 215 of the subset of terminals 215. Each interconnect may include a respective set of signal lines (e.g., set of links). Some or each signal line of the set of signal lines may be a same length or of a substantially similar length. For instance, the signal lines within one or more groups of adjacent signal lines within the interconnect may each be the same length or of a substantially similar length. Additional details about interconnects may be described herein, for instance, with reference to FIG. 3.

In some examples, host device 105-a or memory device 110-a may transmit a first signal over a first signal line of the set of signal lines. Due to a proximity and/or a capacitance (e.g., broadside coupling, capacitive coupling caused by a change in voltage with respect to time at an aggressor signal line and/or by the effect of an electric field on the victim signal line) between the first signal line and a second signal line that is adjacent to the first signal line, the first signal may generate interference at the second signal line which may be referred to as cross-talk interference. The interference at the second signal line may interfere with a second signal over the second signal line. If the interference is high enough (e.g., above a threshold amount), the device receiving the second signal may fail to decode or may inaccurately decode the second signal. Failing to decode or inaccurately decoding the second signal may decrease the efficiency of communications between host device 105-a and memory device 110-a.

The methods described herein may enable host device 105-a and/or memory device 110-a to mitigate cross-talk interference between two signal lines. For instance, a transmitting device (e.g., one of host device 105-a and/or memory device 110-a) may generate a third signal that at least partially cancels out the interference introduced by the first signal on the second signal line. Generating the third signal may include inverting the first signal and filtering the inverted first signal through a band-pass filter. By generating the third signal in this manner, the amount of interference on the second signal line may decrease. Accordingly, the receiving device (e.g., the other of host device 105-a and memory device 110-a) may be more likely to succeed in decoding and/or to accurately decode the second signal from the transmitting device. Although interconnects of an interposer 205 are described herein, the techniques described herein may be used for any two signal lines (e.g., channels 115 as described with reference to FIG. 1) between a host device 105-a and memory device 110-a that are of a same length or are of a substantially similar length. Additionally, the techniques described herein may apply to interconnect structures other than (e.g., denser than) the interposer 205, such as an EMIB.

Figure 3:
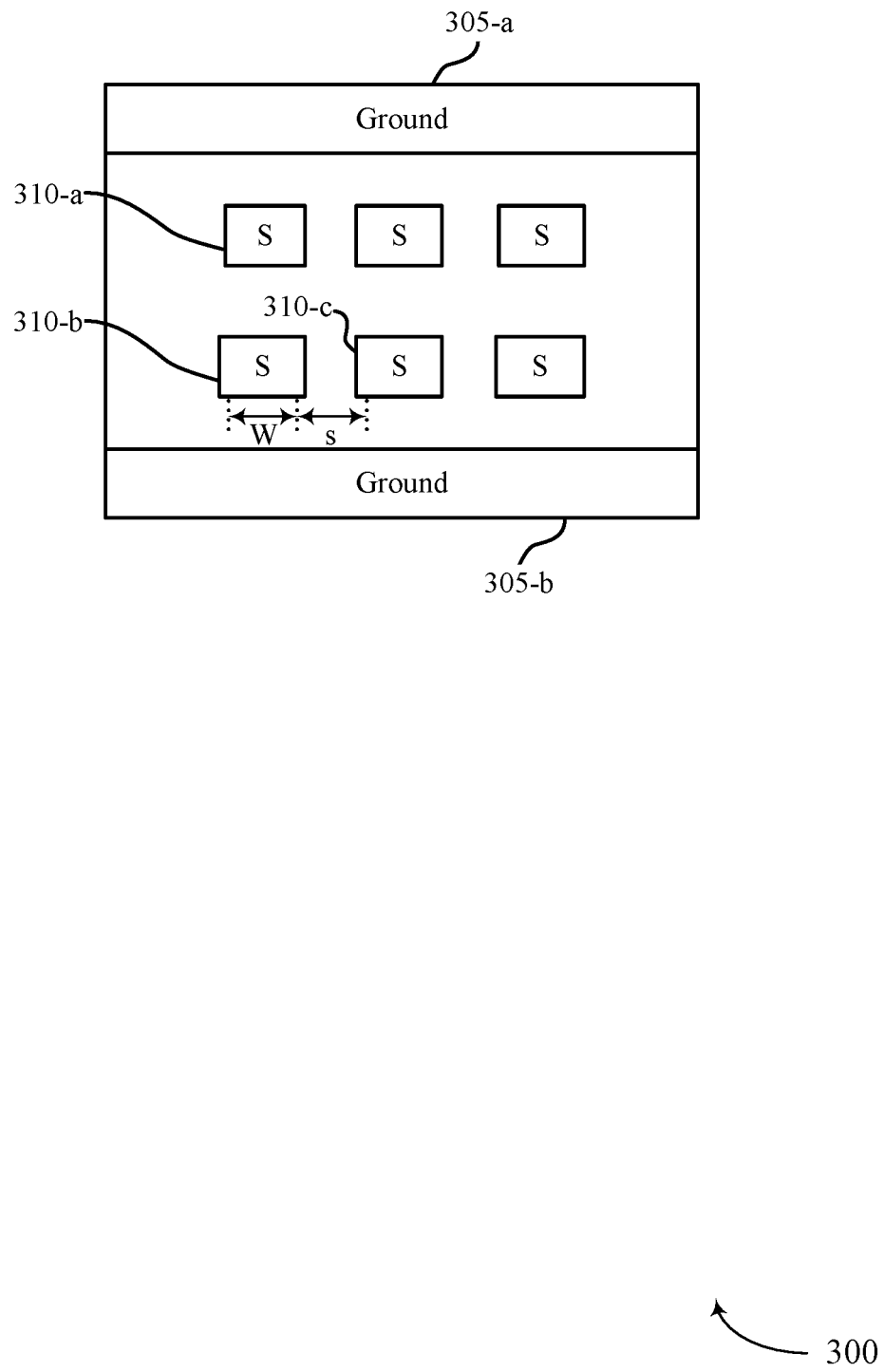
FIG. 3 illustrates an example of an interconnect that supports crosstalk cancellation for signal lines in accordance with examples as disclosed herein.

FIG. 3 illustrates an example of an interconnect 300 that supports crosstalk cancellation for signal lines in accordance with examples as disclosed herein. In some examples, interconnect 300 may be implemented by one or more aspects of system 200. For instance, interconnect 300 may be an example of an interconnect of an interposer 205 that couples host device 105-a with memory device 110-a. In some examples, memory device 110-a may be an example of an HBM.

Interconnect 300 may include ground planes 305-a and 305-b that each extend in a first direction and a second direction (e.g., an x-direction and a y-direction). In some examples, ground planes 305-a and 305-b may be parallel to each other. Additionally, interconnect 300 may include a set of signal lines 310 couplable with a host device 105 for a memory device 110, where each signal line 310 of the set of signal lines 310 extends in the first direction (e.g., the y-direction, which may be into and out of the page as illustrated in FIG. 3) between ground plane 305-a and ground plane 305-b. In some examples, each signal line 310 of the set of signal lines 310 may overlap with a first other signal line 310 of the set of signal lines 310 along the second direction (e.g., for each signal line 310 of the set of signal lines 310, a line in the x-direction, which may be horizontal across the page as illustrated in FIG. 3, may intersect the signal line 310 and at least one first other signal line 310 of the set of signal lines 310). For instance, signal line 310-b may overlap with signal line 310-c along the second direction. Additionally or alternatively, each signal line 310 of the set of signal lines 310 may overlap with a second other signal line 310 of the set of signal lines along a third direction that is orthogonal to the first direction and the second direction (e.g., for each signal line 310 of the set of signal lines 310, a line in the z-direction, which may be vertical across the page as illustrated in FIG. 3, may intersect the signal line 310 and at least one second other signal line 310 of the set of signal lines 310). For instance, signal line 310-b may overlap with signal line 310-a along the third direction.

In some examples, the host device or the memory device may transmit a first signal over a first signal line 310-b of the set of signal lines 310. Due to broadside coupling between the first signal line 310-b and a second signal line that is adjacent to the first signal line 310-b (e.g., signal line 310-a), the first signal may generate interference at the second signal line 310 which may be referred to as cross-talk interference. Broadside coupling may generally refer to coupling that occurs between wider portions of signal lines 310. For instance, in the present example, broadside coupling may occur between the upper horizontal face of signal line 310-b and the lower horizontal face of signal line 310-a. In some examples, crosstalk interference may additionally or alternatively occur due to coupling between narrower portions of signal lines. For instance, in some examples, coupling may occur between the right vertical face of signal line 310-b and the left vertical face of signal line 310-c. Setting aside differences in separation distance or other additional factors, the coupling that occurs between narrower portions of signal lines 310 may create less crosstalk interference than coupling between the wider portions. Accordingly, there may be some examples in which coupling may be cancelled between signal lines 310 that are vertically adjacent (e.g., signal lines 310-a and 310-b) but not signal lines 310 that are horizontally adjacent (signal lines 310-b and 310-c). In some examples, the first signal line 310-b generating the interference may be referred to as an aggressor line and the second signal line 310 receiving the interference may be referred to as a victim line. Failing to decode or inaccurately decoding the second signal may decrease the efficiency of communications between the host device and the memory device.

One method for mitigating cross-talk interference may involve replacing one or more signal lines 310 with ground lines, which may be a line that is coupled to ground. For instance, cross-talk interference between signal line 310-b and signal lines 310-a and/or 310-c may be mitigated by replacing signal line 310-b with a corresponding ground line. However, replacing one or more signal lines (e.g., up to half of signal lines 310) with corresponding ground lines may decrease bandwidth density (e.g., by half, if half of signal lines 310 are replaced with ground lines). Decreasing bandwidth density may decrease the efficiency of communications between a host device 105 and a memory device 110.

The methods described herein may enable a host device and/or a memory device to mitigate cross-talk interference between two signal lines and support an interconnect with improved bandwidth density, such as interconnect 300. For instance, the bandwidth density for an example in which signal lines 310-a are spaced out as depicted in FIG. 3 may be equal to 2*DataRate/(W+s), where DataRate corresponds to a data rate, W corresponds to a width of a signal line 310, and s corresponds to a spacing between signal lines 310. However, the bandwidth density in examples in which one or more signal lines 310 are replaced by ground lines may be less than or equal to 2*DataRate/(W+s) (e.g., in examples in which half of the signal lines 310 are replaced by ground lines may be equal to DataRate/(W+s)).

In some examples, a transmitting device (e.g., one of the host device and the memory device) may generate a third signal that at least partially cancels out the interference introduced by the first signal on the second signal line 310. Generating the third signal may include inverting the first signal and filtering the inverted first signal through a band-pass filter. By generating the third signal in this manner, the amount of interference on the second signal line 310 may decrease. Accordingly, the receiving device (e.g., the other of the host device and the memory device) may be more likely to succeed in decoding and/or to accurately decode the second signal from the transmitting device. Additionally, the methods described herein may enable an increased pin count for the memory device and/or the host device and may additionally increase area efficiency. Although examples herein may be described in the context of memory systems, the teachings herein may apply to any set of signal lines 310 in any electronic system.

Figure 4A:
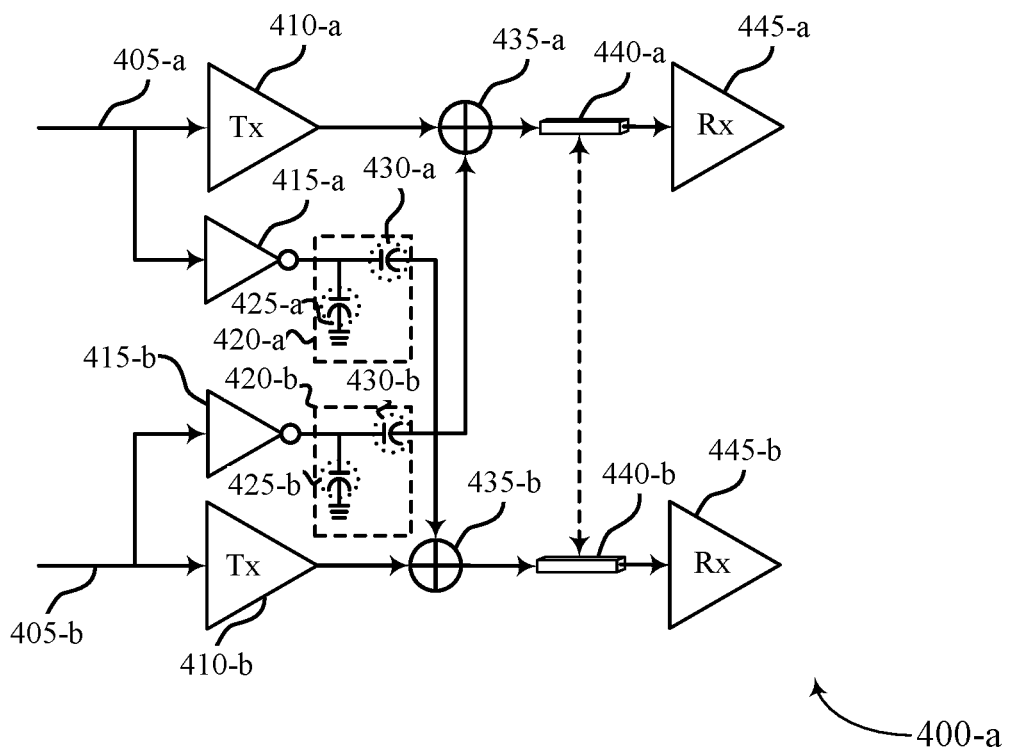
FIG. 4A illustrates an example of an architecture that supports crosstalk cancellation for signal lines in accordance with examples as disclosed herein.
Figure 4B:
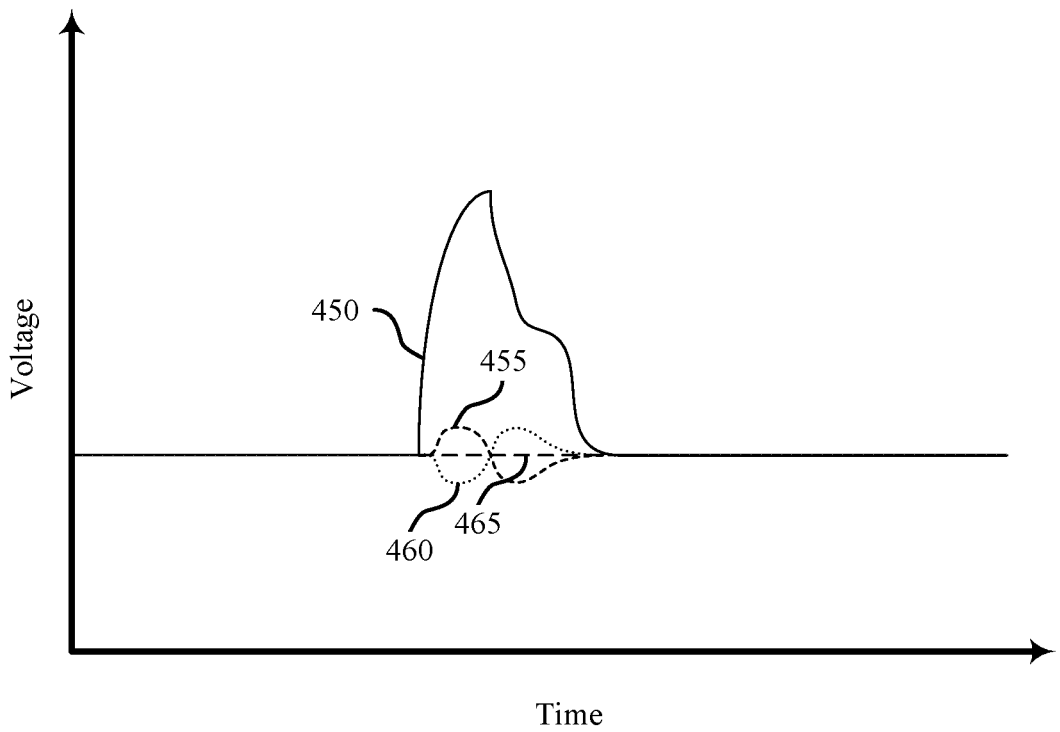
FIG. 4B illustrates an example of a timing diagram that supports crosstalk cancellation for signal lines in accordance with examples as disclosed herein.

FIGS. 4A and 4B illustrate example of an architecture 400-a and a timing diagram 400-b, respectively, that supports crosstalk cancellation for signal lines in accordance with examples as disclosed herein. In some examples, architecture 400-a may be implemented by one or more aspects of system 100, system 200, interconnect 300, or any combination thereof. For instance, each of input lines 405-a and 405-b, transmitters 410-a and 410-b, inverters 415-a and 415-b, band-pass filters 420-a and 420-b, and signal combiners 435-a and 435-b may be included in a transmitting device (e.g., one of a host device 105 or memory device 110 as described with reference to FIG. 1 or one of a host device 105-a or memory device 110-a as described with reference to FIG. 2). Additionally or alternatively, signal lines 440-a and 440-b may be examples of signal lines 310 as described with reference to FIG. 3. Additionally or alternatively, receivers 445-a and 445-b may be included in a receiving device (e.g., the other of the host device 105 or the memory device 110 as described with reference to FIG. 1 or the other of the host device 105-a or the memory device 110-a as described with reference to FIG. 2). For example, signal lines 440-a and 440-b may be an example of a pair of signal line 310 subject to broadside coupling (e.g., signal lines 310-a and 310-b) or of any other pair of signal lines for which crosstalk cancellation is desired (e.g., signal lines 310-b and 310-c).

Input line 405-a may be coupled with transmitter 410-a and inverter 415-a. Inverter 415-a may be coupled with a band-pass filter 420-a, which may include a first capacitor 425-a and a second capacitor 430-a. A first terminal of first capacitor 425-a may be coupled with inverter 415-a and a first terminal of second capacitor 430-a, and a second terminal of first capacitor 425-a may be coupled with ground.

Input line 405-b may be coupled with transmitter 410-b and inverter 415-b. Inverter 415-b may be coupled with a band-pass filter 420-b, which may include a first capacitor 425-b and a second capacitor 430-b. A first terminal of first capacitor 425-b may be coupled with inverter 415-b and a second terminal of second capacitor 430-b, and a second terminal of first capacitor 425-b may be coupled with ground.

Signal combiner 435-a may be coupled with transmitter 410-a and a second terminal of second capacitor 430-b, and signal combiner 435-b may be coupled with transmitter 410-b and a second terminal of second capacitor 430-a. Additionally, signal combiner 435-a may be coupled with signal line 440-a and signal combiner 435-b may be coupled with signal line 440-b. Signal line 440-a may be coupled with receiver 445-a and signal line 440-b may be coupled with receiver 445-b.

Input line 405-a may provide a first signal (e.g., a first data signal) to be transmitted to receiver 445-a. Transmitter 410-a may be configured to provide the first signal to signal line 440-a. Inverter 415-a may be configured to invert the first signal and band-pass filter 420-a may be configured to modulate (e.g., attenuate) the inverted first signal. For instance, band-pass filter 420-a may be configured to modulate (e.g., attenuate) a first range of frequencies of the inverted first signal and a second range of frequencies of the inverted first signal, where the first range of frequencies is below a first threshold frequency and the second range of frequencies is above a second threshold frequency that is greater than the first threshold frequency. First capacitor 425-a may be configured to modulate (e.g., attenuate) the second range of frequencies of the inverted first signal (e.g., first capacitor 425-a may act as a low-pass filter) and second capacitor 430-a may be configured to modulate (e.g., attenuate) the first range of frequencies of the inverted first signal (e.g., second capacitor 430-a may act as a high-pass filter).

Input line 405-b may provide a second signal (e.g., a second data signal) to be transmitted to receiver 445-b. Transmitter 410-b may be configured to provide the second signal to signal line 440-b. Inverter 415-b may be configured to invert the second signal and band-pass filter 420-b may be configured to modulate the inverted second signal. For instance, band-pass filter 420-b may be configured to modulate a first range of frequencies of the inverted second signal and a second range of frequencies of the inverted second signal, where the first range of frequencies is below a first threshold frequency and the second range of frequencies is above a second threshold frequency that is greater than the first threshold frequency. First capacitor 425-b may be configured to modulate the second range of frequencies of the inverted second signal (e.g., first capacitor 425-b may act as a low-pass filter) and second capacitor 430-b may be configured to modulate the first range of frequencies of the inverted second signal (e.g., second capacitor 430-b may act as a high-pass filter).

Signal combiner 435-a may be configured to combine the first signal with the inverted, modulated second signal and to output the combined signals to signal line 440-a. Signal line 440-a may carry the combined signals to receiver 445-a, which may be configured to receive the combined signals. Signal combiner 435-b may be configured to combine the second signal with the inverted, modulated first signal and to output the combined signals to signal line 440-b. Signal line 440-b may carry the combined signals to receiver 445-b, which may be configured to receive the combined signals.

In some examples, as illustrated by FIG. 4B, the first signal may generate interference on the second signal line

440-*b* and/or the second signal may generate interference on the first signal line 440-*a*. For instance, signal 450 may represent the first signal or the second signal. The signal line 440 that carries the first signal or the second signal may generate cross-talk interference 455 on another signal line 440. For instance, if signal 450 corresponds to the first signal on signal line 440-*a*, then cross-talk interference 455 may correspond to cross-talk interference generated on signal line 440-*b*.

Signal 460 (e.g., residual crosstalk) may represent the inverted, modulated signal on the other signal line 440 and generated from signal 450. For instance, if signal 450 corresponds to the first signal on signal line 440-*a*, signal 460 may correspond to the inverted, modulated first signal on signal line 440-*b* produced by passing the first signal through inverter 415-*a* and band-pass filter 420-*a*. Cross-talk interference 455 and signal 460 may combine to produce signal 465. Signal 465 may be flat, as depicted in the present example, or may be a signal that has a lower average power than both of cross-talk interference 455 and signal 460. Additionally or alternatively, signal 465 may be a signal that has a lower amplitude (e.g., in terms of voltage, current, power, or any combination thereof), a lower magnitude, or both, relative to one or both of cross-talk interference 455 and signal 460.

By generating signal 460 in this manner, the interference on the other signal line 440 may be reduced. Accordingly, in examples where the other signal line 440 (e.g., signal line 440-*b* in examples in which the first signal is generating cross-talk interference on signal line 440-*b*) carries a signal (e.g., the second signal), the device receiving the signal may be more likely to successfully decode and/or decode more successfully the signal on the other signal line 440. In some examples, cross-talk interference 455 and signal 460 may be opposite polarity pulses.

In some examples, different groups of signal lines 440 within a same interconnect may have different lengths. To account for signal lines 440 with different lengths, some groups of signal lines 440 may have associated band-pass filters 420 whose first capacitor 425, second capacitor 430, or both have different capacitances. Additionally or alternatively, different groups of signal lines 440 of different lengths may have a same low-pass filter capacitance (e.g., a same capacitance for their respective first capacitors 425) but different high-pass filter capacitances (e.g., different capacitances for their respective second capacitors 430).

In some examples, using a band-pass filter 420 for crosstalk cancellation may have one or more advantages over using just a high-pass filter (e.g., removing the first capacitor 425 and leaving the second capacitor 430), as may be appreciated by those of ordinary skill in the art. For instance, a signal modulated by the band-pass filter 420 (e.g., signal 460) may, on average, combine with cross-talk interference 455 to produce a signal 460 with a lower average power than the cross-talk interference 455.

Figure 5:
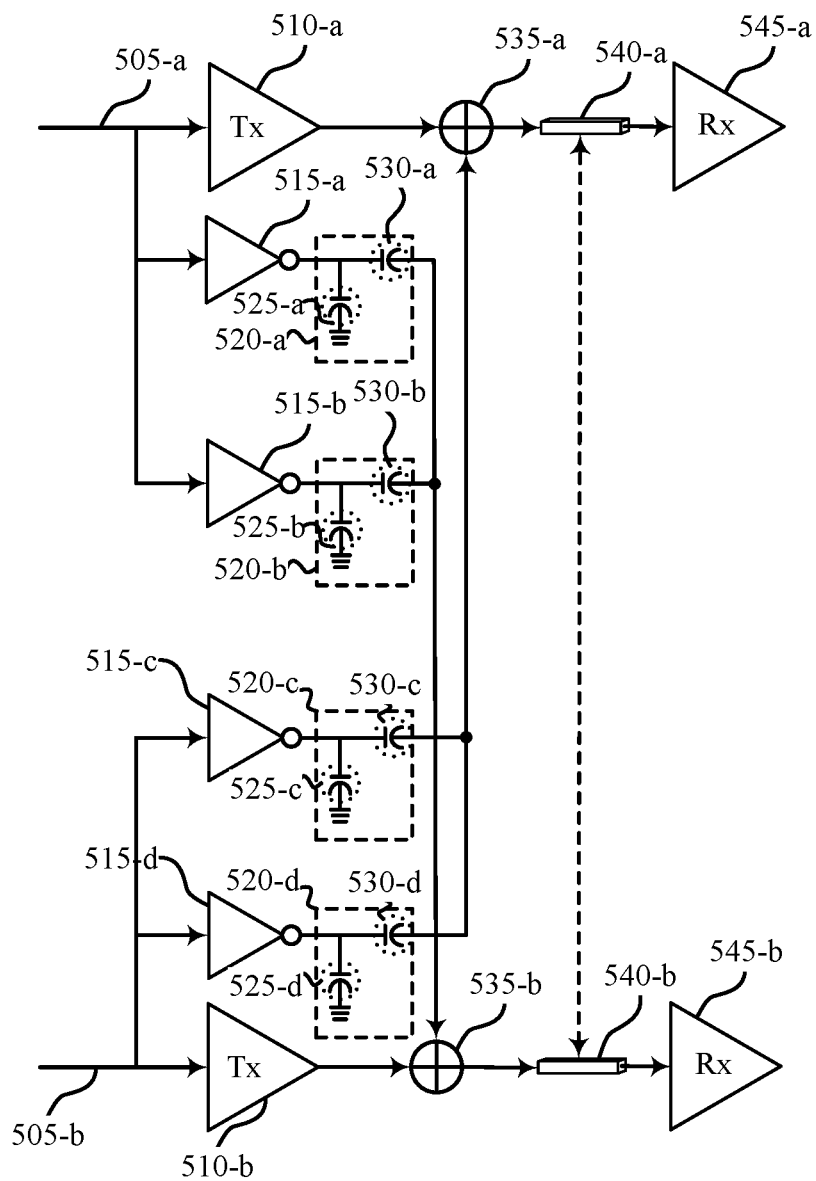
FIG. 5 illustrates an example of another architecture that supports crosstalk cancellation for signal lines in accordance with examples as disclosed herein.

FIG. 5 illustrates an example of an architecture 500 that supports crosstalk cancellation for signal lines in accordance with examples as disclosed herein. In some examples, architecture 500 may be implemented by one or more aspects of system 100, system 200, interconnect 300, or any combination thereof. For instance, each of input lines 505-*a* and 505-*b*, transmitters 510-*a* and 510-*b*, inverters 515-*a* through 515-*d*, band-pass filters 520-*a* through 520-*d*, and signal combiners 535-*a* and 535-*b* may be included in a transmitting device (e.g., one of a host device 105 or memory device 110 as described with reference to FIG. 1 or one of a host device 105-*a* or memory device 110-*a* as described with reference to FIG. 2). Additionally or alternatively, signal lines 540-*a* and 540-*b* may be examples of signal lines 310 as described with reference to FIG. 3. Additionally or alternatively, receivers 545-*a* and 545-*b* may be included in a receiving device (e.g., the other of the host device 105 or the memory device 110 as described with reference to FIG. 1 or the other of the host device 105-*a* or the memory device 110-*a* as described with reference to FIG. 2).

Input line 505-*a* may be coupled with transmitter 510-*a*, inverter 515-*a*, and inverter 515-*b*. Inverter 515-*a* may be coupled with a band-pass filter 520-*a*, which may include a first capacitor 525-*a* and a second capacitor 530-*a*, and inverter 515-*b* may be coupled with band-pass filter 520-*b*. A first terminal of first capacitor 525-*a* may be coupled with inverter 515-*a* and a first terminal of second capacitor 530-*a*, and a second terminal of first capacitor 525-*a* may be coupled with ground. Similarly, a first terminal of first capacitor 525-*b* may be coupled with inverter 515-*b* and a first terminal of second capacitor 530-*b*, and a second terminal of first capacitor 525-*b* may be coupled with ground.

Input line 505-*b* may be coupled with transmitter 510-*b*, inverter 515-*c*, and inverter 515-*d*. Inverter 515-*c* may be coupled with a band-pass filter 520-*c*, which may include a first capacitor 525-*c* and a second capacitor 530-*c*, and inverter 515-*d* may be coupled with band-pass filter 520-*d*, which may include a first capacitor 525-*d* and a second capacitor 530-*d*. A first terminal of first capacitor 525-*c* may be coupled with inverter 515-*c* and a second terminal of second capacitor 530-*c*, and a second terminal of first capacitor 525-*c* may be coupled with ground. Similarly, a first terminal of first capacitor 525-*d* may be coupled with inverter 515-*d* and a second terminal of second capacitor 530-*d*, and a second terminal of first capacitor 525-*d* may be coupled with ground.

Signal combiner 535-*a* may be coupled with transmitter 510-*a*, a second terminal of second capacitor 530-*c*, and a second terminal of second capacitor 530-*d*. Signal combiner 535-*b* may be coupled with transmitter 510-*b*, a second terminal of second capacitor 530-*a*, and a second terminal of second capacitor 530-*b*. Additionally, signal combiner 535-*a* may be coupled with signal line 540-*a* and signal combiner 535-*b* may be coupled with signal line 540-*b*. Signal line 540-*a* may be coupled with receiver 545-*a* and signal line 540-*b* may be coupled with receiver 545-*b*.

Input line 505-*a* may provide a first signal (e.g., a first data signal) to be transmitted to receiver 545-*a*. Transmitter 510-*a* may be configured to provide the first signal to signal line 540-*a*. Inverters 515-*a* and 515-*b* may be configured to invert the first signal and band-pass filters 520-*a* and 520-*b* may be configured to modulate (e.g., attenuate) the inverted first signal. For instance, band-pass filters 520-*a* and 520-*b* may each be configured to modulate (e.g., attenuate) a respective first range of frequencies of the inverted first signal and a respective second range of frequencies of the inverted first signal, where the respective first range of frequencies is below a respective first threshold frequency and the respective second range of frequencies is above a respective second threshold frequency that is greater than the respective first threshold frequency. First capacitors 525-*a* and 525-*b* may each be configured to modulate (e.g., attenuate) the respective second range of frequencies of the inverted first signal (e.g., first capacitors 525-*a* and 525-*b* may each act as a low-pass filter) and second capacitors 530-*a* and 530-*b* may each be configured to modulate (e.g., attenuate) the first range of frequencies of the inverted first signal (e.g., second capacitors 530-a and 530-b may each act as a high-pass filter).

Input line 505-b may provide a second signal (e.g., a second data signal) to be transmitted to receiver 545-b. Transmitter 510-b may be configured to provide the second signal to signal line 540-b. Inverters 515-c and 515-d may be configured to invert the second signal and band-pass filters 520-c and 520-d may be configured to modulate the inverted second signal. For instance, band-pass filters 520-c and 520-d may each be configured to modulate a respective first range of frequencies of the inverted second signal and a respective second range of frequencies of the inverted second signal, where the respective first range of frequencies is below a respective first threshold frequency and the respective second range of frequencies is above a respective second threshold frequency that is greater than the respective first threshold frequency. First capacitors 525-c and 525-d may each be configured to modulate the respective second range of frequencies of the inverted second signal (e.g., first capacitor 525-c and 525-d may each act as a low-pass filter) and second capacitors 530-c and 530-d may each be configured to modulate the respective first range of frequencies of the inverted second signal (e.g., second capacitors 530-c and 530-d may each act as a high-pass filter).

Signal combiner 535-a may each be configured to combine the first signal with the inverted, modulated second signals of band-pass filters 520-a and 520-b and to output the combined signals to signal line 540-a. Signal line 540-a may carry the combined signals to receiver 545-a, which may be configured to receive the combined signals. Signal combiner 535-b may be configured to combine the second signal with the inverted, modulated first signals from band-pass filters 520-c and 520-d and to output the combined signals to signal line 540-b. Signal line 540-b may carry the combined signals to receiver 545-b, which may be configured to receive the combined signals.

Although two inverters 515 and two band-pass filters 520 are depicted for each input line 505, there may be examples in which more than two inverters 515 and two band-pass filters 520 are used for each input line 505.

In some examples, there may be one or more advantages associated using more than one band-pass filter 520 and/or using more than one inverter 515 for each input line 505-a. For instance, using multiple inverters 515 and/or multiple band-pass filters 520 may enable coupling strength to be split into multiple segments to generate a same crosstalk cancellation signal. Additionally, in some cases, manufacturing multiple band-pass filter paths each with capacitors of smaller values may present fewer technical challenges than manufacturing a single band-pass filter path with a capacitor of a larger value. Additionally or alternatively, architecture 500 may support an enhanced tunability with which crosstalk cancellation may be implemented as described herein (e.g., due to an enhanced ability to configure the overall filter characteristics—e.g., individual capacitances—associated with the crosstalk cancellation signal received by a given signal combiner 535).

Figure 6:
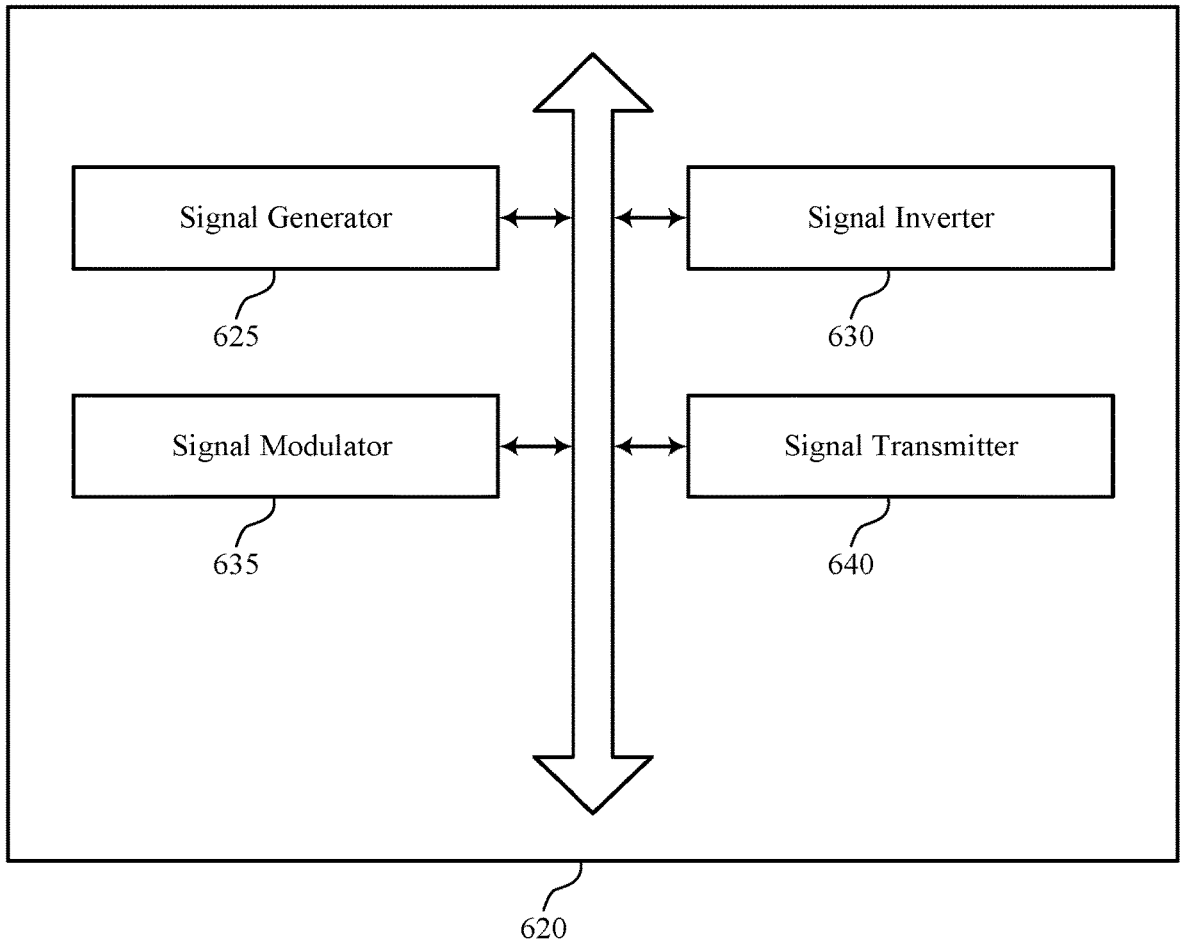
FIG. 6 shows a block diagram of a device that supports crosstalk cancellation for signal lines in accordance with examples as disclosed herein.

FIG. 6 shows a block diagram 600 of a device 620 that supports crosstalk cancellation for signal lines in accordance with examples as disclosed herein. The device 620 may be an example of aspects of a device as described with reference to FIGS. 1 through 5. The device 620, or various components thereof, may be an example of means for performing various aspects of crosstalk cancellation for signal lines as described herein, for instance, with reference to FIGS. 1 through 5. For example, the device 620 may include a signal generator 625, a signal inverter 630, a signal modulator 635, a signal transmitter 640, or any combination thereof. Each of these components may communicate, directly or indirectly, with one another (e.g., via one or more buses or other signal paths).

The signal generator 625 may be configured as or otherwise support a means for generating a first signal based at least in part on data stored at a memory array of a memory device. The signal inverter 630 may be configured as or otherwise support a means for inverting the first signal to obtain an inverted first signal. The signal modulator 635 may be configured as or otherwise support a means for obtaining a second signal based at least in part on modulating (e.g., attenuating) a first range of frequencies of the inverted first signal and a second range of frequencies of the inverted first signal, where the first range of frequencies is below a first threshold frequency and the second range of frequencies is above a second threshold frequency that is greater than the first threshold frequency. The signal transmitter 640 may be configured as or otherwise support a means for transmitting the first signal via a first signal line of a set of signal lines and the second signal via a second signal line of the set of signal lines, where each signal line of the set of signal lines is couplable with a host device for the memory device.

In some examples, to support modulating the first range of frequencies, the signal modulator 635 may be configured as or otherwise support a means for modulating the first range of frequencies using a capacitor coupled with the second signal line.

In some examples, to support modulating the second range of frequencies, the signal modulator 635 may be configured as or otherwise support a means for modulating the second range of frequencies using a second capacitor coupled with the capacitor and a ground reference.

In some examples, the signal inverter 630 may be configured as or otherwise support a means for inverting a third signal to obtain an inverted third signal. In some examples, the signal generator 625 may be configured as or otherwise support a means for generating a fourth signal based at least in part on modulating a third range of frequencies of the inverted third signal and a fourth range of frequencies of the inverted third signal, where the third range of frequencies is below a third threshold frequency and the fourth range of frequencies is above a fourth threshold frequency that is greater than the third threshold frequency. In some examples, the signal transmitter 640 may be configured as or otherwise support a means for transmitting the third signal via the second signal line of the set of signal lines.

In some examples, the second signal may be configured to combine with a fifth signal to generate a sixth signal that is associated with the second signal line and has a lower amplitude than each of the second signal and the fifth signal. In some examples, the fifth signal is based at least in part on a rate of change of the first signal.

In some examples, the fifth signal may be based at least in part on a capacitance associated with the first signal line and the second signal line.

Figure 7:
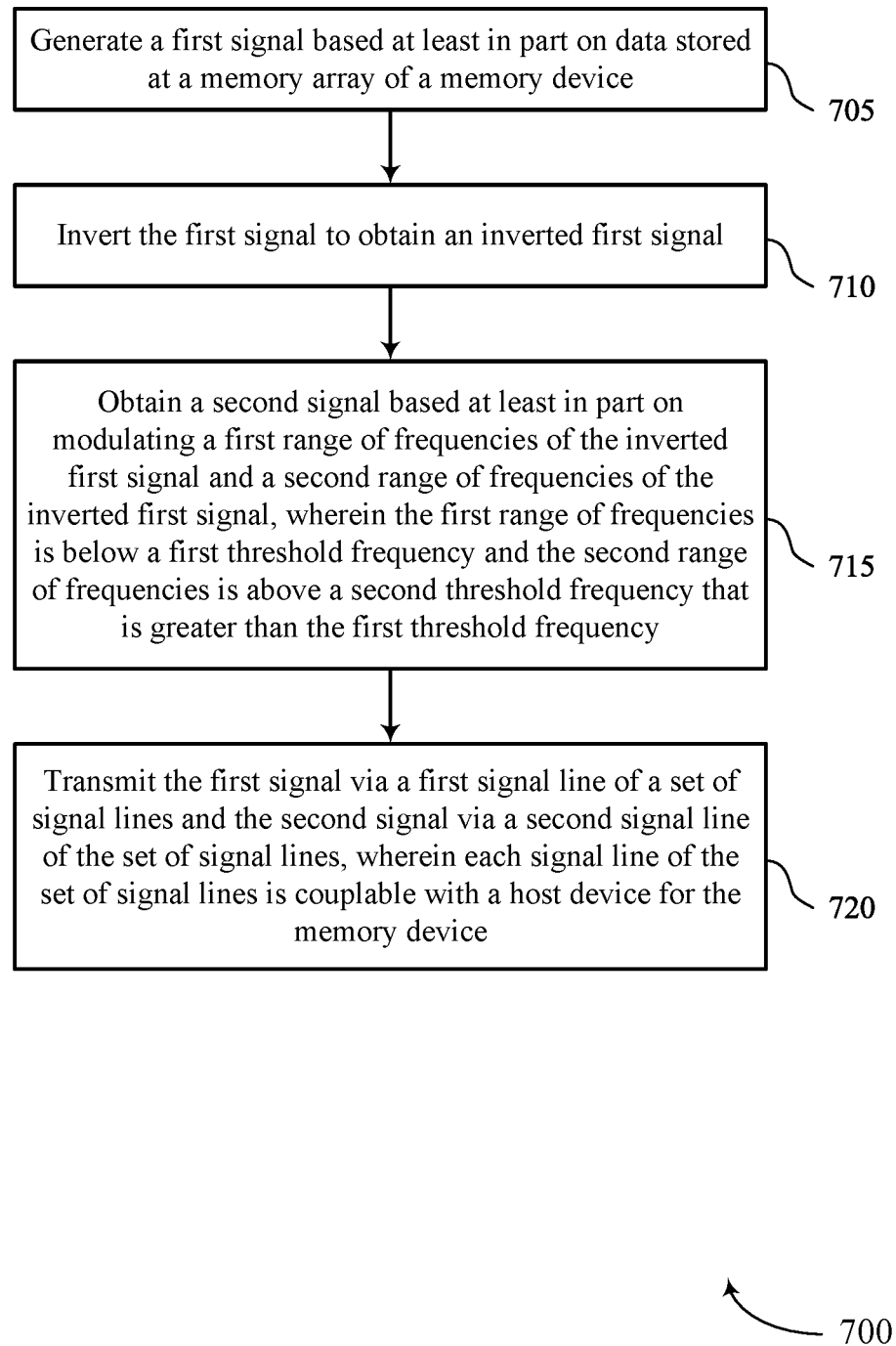
FIG. 7 shows a flowchart illustrating a method or methods that support crosstalk cancellation for signal lines in accordance with examples as disclosed herein.

FIG. 7 shows a flowchart illustrating a method 700 that supports crosstalk cancellation for signal lines in accordance with examples as disclosed herein. The operations of method 700 may be implemented by a device or its components as described herein, for instance, with reference to FIGS. 1 through 6. For example, the operations of method 700 may be performed by a device as described with reference to FIGS. 1 through 6. In some examples, a device may execute a set of instructions to control the functional elements of the device to perform the described functions. Additionally or alternatively, the device may perform aspects of the described functions using special-purpose hardware.

At 705, the method may include generating a first signal based at least in part on data stored at a memory array of a memory device. The operations of 705 may be performed in accordance with examples as disclosed herein. In some examples, aspects of the operations of 705 may be performed by a signal generator 625 as described with reference to FIG. 6.

At 710, the method may include inverting the first signal to obtain an inverted first signal. The operations of 710 may be performed in accordance with examples as disclosed herein. In some examples, aspects of the operations of 710 may be performed by a signal inverter 630 as described with reference to FIG. 6.

At 715, the method may include obtaining a second signal based at least in part on modulating a first range of frequencies of the inverted first signal and a second range of frequencies of the inverted first signal, where the first range of frequencies is below a first threshold frequency and the second range of frequencies is above a second threshold frequency that is greater than the first threshold frequency. The operations of 715 may be performed in accordance with examples as disclosed herein. In some examples, aspects of the operations of 715 may be performed by a signal modulator 635 as described with reference to FIG. 6.

At 720, the method may include transmitting the first signal via a first signal line of a set of signal lines and the second signal via a second signal line of the set of signal lines, where each signal line of the set of signal lines is couplable with a host device for the memory device. The operations of 720 may be performed in accordance with examples as disclosed herein. In some examples, aspects of the operations of 720 may be performed by a signal transmitter 640 as described with reference to FIG. 6.

In some examples, an apparatus as described herein (e.g., with reference to FIGS. 1 through 6) may perform a method or methods, such as the method 700. The apparatus may include, features, circuitry, logic, means, or instructions (e.g., a non-transitory computer-readable medium storing instructions executable by a processor) for generating a first signal based at least in part on data stored at a memory array of a memory device, inverting the first signal to obtain an inverted first signal, obtaining a second signal based at least in part on modulating (e.g., attenuating) a first range of frequencies of the inverted first signal and a second range of frequencies of the inverted first signal, where the first range of frequencies is below a first threshold frequency and the second range of frequencies is above a second threshold frequency that is greater than the first threshold frequency, and transmitting the first signal via a first signal line of a set of signal lines and the second signal via a second signal line of the set of signal lines, where each signal line of the set of signal lines is couplable with a host device for the memory device.

In some examples of the method 700 and the apparatus described herein, operations, features, circuitry, logic, means, or instructions for modulating the first range of frequencies may include operations, features, circuitry, logic, means, or instructions for modulating the first range of frequencies using a capacitor coupled with the second signal line.

In some examples of the method 700 and the apparatus described herein, operations, features, circuitry, logic, means, or instructions for modulating the second range of frequencies may include operations, features, circuitry, logic, means, or instructions for modulating the second range of frequencies using a second capacitor coupled with the capacitor and a ground reference.

Some examples of the method 700 and the apparatus described herein may further include operations, features, circuitry, logic, means, or instructions for inverting a third signal to obtain an inverted third signal, generating a fourth signal based at least in part on modulating a third range of frequencies of the inverted third signal and a fourth range of frequencies of the inverted third signal, where the third range of frequencies may be below a third threshold frequency and the fourth range of frequencies may be above a fourth threshold frequency that may be greater than the third threshold frequency, and transmitting the third signal via the second signal line of the set of signal lines.

In some examples of the method 700 and the apparatus described herein, the second signal may be configured to combine with a fifth signal to generate a sixth signal that may be associated with the second signal line and may have a lower amplitude than each of the second signal and the fifth signal, and the fifth signal may be based at least in part on a rate of change of the first signal.

In some examples of the method 700 and the apparatus described herein, the fifth signal may be based at least in part on a capacitance associated with the first signal line and the second signal line.

It should be noted that the methods described herein describe possible implementations, and that the operations and the steps may be rearranged or otherwise modified and that other implementations are possible. Further, portions from two or more of the methods may be combined.

An apparatus is described. The apparatus may include a set of signal lines each couplable with a host device for a memory device, where the set of signal lines includes a first signal line and a second signal line. The apparatus may further include an inverter configured to receive a first signal that is based at least in part on data stored at a memory array of the memory device, where the inverter is configured to invert the first signal to obtain an inverted first signal, and where the first signal is for transmission via the first signal line. The apparatus may further include a band-pass filter coupled with the inverter and the second signal line, the band-pass filter configured to provide a second signal for transmission via the second signal line based at least in part on modulating a first range of frequencies of the inverted first signal and a second range of frequencies of the inverted first signal, where the first range of frequencies is below a first threshold frequency and the second range of frequencies is above a second threshold frequency that is greater than the first threshold frequency.

In some examples of the apparatus, the band-pass filter may include a capacitor configured to modulate the first range of frequencies of the inverted first signal, where a first terminal of the capacitor may be coupled with the inverter and a second terminal of the capacitor may be coupled with the second signal line.

In some examples of the apparatus, the band-pass filter may include a second capacitor configured to modulate the second range of frequencies of the inverted first signal, where a first terminal of the second capacitor may be coupled with the inverter and a second terminal of the capacitor may be coupled with a ground reference.

In some examples, the apparatus may include a second inverter configured to invert a third signal to obtain an inverted third signal, where the third signal may be for transmission via the second signal line, and a second band-pass filter coupled with the second inverter and the first signal line, the second band-pass filter configured to generate a fourth signal for transmission via the first signal line based at least in part on modulating a third range of frequencies of the inverted third signal and a fourth range of frequencies of the inverted third signal, where the third range of frequencies may be below a third threshold frequency and the fourth range of frequencies may be above a fourth threshold frequency that may be greater than the third threshold frequency.

In some examples, the apparatus may include a third inverter configured to invert the first signal to obtain a second inverted first signal and a second band-pass filter coupled with the third inverter and the second signal line, the second band-pass filter configured to contribute to the second signal based at least in part on modulating a fifth range of frequencies of the second inverted first signal and a sixth range of frequencies of the second inverted first signal, where the fifth range of frequencies may be below a fifth threshold frequency and the sixth range of frequencies may be above a sixth threshold frequency that may be greater than the fifth threshold frequency.

In some examples of the apparatus, a first terminal of the inverter and a first terminal of the third inverter may be each coupled with a first node, and the inverter and the third inverter may be each configured to receive the first signal via the first node.

In some examples, the apparatus may include an interconnect, where the set of signal lines may be each couplable with the host device via the interconnect. The interconnect may include a first ground plane extending in a first direction and a second direction, a second ground plane parallel to the first ground plane, and a second set of signal lines that each extend in the first direction between the first ground plane and the second ground plane, where each signal line of the second set of signal lines may be couplable with the host device and with a respective signal line of the set of signal lines.

In some examples of the apparatus, the first signal line may overlap with the second signal line in the second direction and may be non-overlapping with the second signal line in a third direction orthogonal to the first direction and the second direction.

In some examples of the apparatus, the first signal line may overlap with the second signal line in a third direction orthogonal to the first direction and the second direction and may be non-overlapping with the second signal line in the second direction.

In some examples of the apparatus, the interconnect may be or include a silicon interposer.

In some examples of the apparatus, the second signal may be configured to combine with a fifth signal to generate a sixth signal that is associated with the second signal line and may have a lower amplitude than each of the second signal and the fifth signal, and the fifth signal may be based at least in part on a rate of change of the first signal.

In some examples of the apparatus, the fifth signal may be based at least in part on a capacitance associated with the first signal line and the second signal line.

Another apparatus is described. The apparatus may include a first ground plane extending in a first direction and a second direction, a second ground plane parallel to the first ground plane, and a set of signal lines couplable with a host device for a memory device. Each signal line of the set of signal lines may extends in the first direction between the first ground plane and the second ground plane, overlap with a first other signal line of the set of signal lines along the second direction, and overlap with a second other signal line of the set of signal lines along a third direction that is orthogonal to the first direction and the second direction. The apparatus may further include circuitry configured to transmit a first signal via first a first signal line of the set of signal lines, transmit a second signal via a second signal line of the set of signal lines, and transmit a third signal via the second signal line, the third signal for combining with a fourth signal on the second signal line to obtain a fifth signal via the second signal line with a lower amplitude than each of the third signal and the fourth signal, and the fourth signal based at least in part on the first signal and a capacitance between the first signal line and the second signal line.

In some examples, the circuitry may be further configured to provide the third signal based at least in part on inverting the first signal to obtain an inverted first signal.

In some examples, the circuitry may be further configured to provide the third signal based at least in part on modulating a first range of frequencies of the inverted first signal and a second range of frequencies of the inverted first signal, where the first range of frequencies may be below a first threshold frequency and the second range of frequencies may be above a second threshold frequency that may be greater than the first threshold frequency.

In some examples of the apparatus, the circuitry may include a capacitor configured to modulate the first range of frequencies of the inverted first signal, where the capacitor may be coupled with the second signal line.

In some examples of the apparatus, the circuitry may include a second capacitor configured to modulate the second range of frequencies of the inverted first signal, where a first terminal of the second capacitor may be coupled with the capacitor and a second terminal of the second capacitor may be coupled with a ground reference.

In some examples of the apparatus, the first signal line may overlap with the second signal line along the third direction and may be non-overlapping with the second signal line along the second direction.

In some examples of the apparatus, the first ground plane, the second ground plane, and the set of signal lines may be included in a silicon interposer, and the circuitry may be included in the memory device or the host device.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
a set of signal lines each couplable with a host device for a memory device, wherein the set of signal lines comprises a first signal line and a second signal line;
an inverter configured to receive a first signal that is based at least in part on data stored at a memory array of the memory device, wherein the inverter is configured to invert the first signal to obtain an inverted first signal, and wherein the first signal is for transmission via the first signal line; and
a band-pass filter coupled with the inverter and the second signal line, the band-pass filter configured to provide a second signal for transmission via the second signal line based at least in part on modulating a first range of frequencies of the inverted first signal and a second range of frequencies of the inverted first signal, wherein the first range of frequencies is below a first threshold frequency and the second range of frequencies is above a second threshold frequency that is greater than the first threshold frequency, wherein the band-pass filter comprises a capacitor configured to modulate the first range of frequencies of the inverted first signal, wherein a first terminal of the capacitor is coupled with the inverter and a second terminal of the capacitor is coupled with the second signal line.

2. The apparatus of claim 1, wherein:
the second signal is configured to combine with a fifth signal to generate a sixth signal that is associated with the second signal line and has a lower amplitude than each of the second signal and the fifth signal, and
the fifth signal is based at least in part on a rate of change of the first signal.

3. The apparatus of claim 2, wherein the fifth signal is based at least in part on a capacitance associated with the first signal line and the second signal line.

4. The apparatus of claim 1, further comprising:
a second inverter configured to invert a third signal to obtain an inverted third signal, wherein the third signal is for transmission via the second signal line; and
a second band-pass filter coupled with the second inverter and the first signal line, the second band-pass filter configured to generate a fourth signal for transmission via the first signal line based at least in part on modulating a third range of frequencies of the inverted third signal and a fourth range of frequencies of the inverted third signal, wherein the third range of frequencies is below a third threshold frequency and the fourth range of frequencies is above a fourth threshold frequency that is greater than the third threshold frequency.

5. The apparatus of claim 1, further comprising:
a third inverter configured to invert the first signal to obtain a second inverted first signal; and
a second band-pass filter coupled with the third inverter and the second signal line, the second band-pass filter configured to contribute to the second signal based at least in part on modulating a fifth range of frequencies of the second inverted first signal and a sixth range of frequencies of the second inverted first signal, wherein the fifth range of frequencies is below a fifth threshold frequency and the sixth range of frequencies is above a sixth threshold frequency that is greater than the fifth threshold frequency.

6. The apparatus of claim 5, wherein:
a first terminal of the inverter and a first terminal of the third inverter are each coupled with a first node; and
the inverter and the third inverter are each configured to receive the first signal via the first node.

7. The apparatus of claim 1, further comprising:
an interconnect, wherein the set of signal lines are each couplable with the host device via the interconnect, and wherein the interconnect comprises:
a first ground plane extending in a first direction and a second direction;
a second ground plane parallel to the first ground plane; and
a second set of signal lines that each extend in the first direction between the first ground plane and the second ground plane, wherein each signal line of the second set of signal lines is couplable with the host device and with a respective signal line of the set of signal lines.

8. The apparatus of claim 7, wherein the first signal line overlaps with the second signal line in the second direction and is non-overlapping with the second signal line in a third direction orthogonal to the first direction and the second direction.

9. The apparatus of claim 7, wherein the first signal line overlaps with the second signal line in a third direction orthogonal to the first direction and the second direction and is non-overlapping with the second signal line in the second direction.

10. The apparatus of claim 7, wherein the interconnect comprises a silicon interposer.

11. The apparatus of claim 1, wherein the band-pass filter comprises:
a second capacitor configured to modulate the second range of frequencies of the inverted first signal, wherein a first terminal of the second capacitor is coupled with the inverter and a second terminal of the capacitor is coupled with a ground reference.

12. A method, comprising:
generating a first signal based at least in part on data stored at a memory array of a memory device;
inverting the first signal to obtain an inverted first signal;
obtaining a second signal based at least in part on modulating a first range of frequencies of the inverted first signal and a second range of frequencies of the inverted first signal, wherein the first range of frequencies is below a first threshold frequency and the second range of frequencies is above a second threshold frequency that is greater than the first threshold frequency, wherein modulating the first range of frequencies comprises modulating the first range of frequencies using a capacitor coupled with a second signal line; and
transmitting the first signal via a first signal line of a set of signal lines and the second signal via the second signal line of the set of signal lines, wherein each signal line of the set of signal lines is couplable with a host device for the memory device.

13. The method of claim 12, wherein:
the second signal is configured to combine with a fifth signal to generate a sixth signal that is associated with the second signal line and has a lower amplitude than each of the second signal and the fifth signal, and
the fifth signal is based at least in part on a rate of change of the first signal.

14. The method of claim 13, wherein the fifth signal is based at least in part on a capacitance associated with the first signal line and the second signal line.

15. The method of claim 12, wherein modulating the second range of frequencies comprises:
modulating the second range of frequencies using a second capacitor coupled with the capacitor and a ground reference.

16. The method of claim 12, further comprising:
inverting a third signal to obtain an inverted third signal;
generating a fourth signal based at least in part on modulating a third range of frequencies of the inverted third signal and a fourth range of frequencies of the inverted third signal, wherein the third range of frequencies is below a third threshold frequency and the fourth range of frequencies is above a fourth threshold frequency that is greater than the third threshold frequency; and
transmitting the third signal via the second signal line of the set of signal lines.

* * * * *